United States Patent
Hsieh et al.

(10) Patent No.: US 6,949,396 B2
(45) Date of Patent: Sep. 27, 2005

(54) CORNER COMPENSATION METHOD FOR FABRICATING MEMS AND STRUCTURE THEREOF

(75) Inventors: Jerwei Hsieh, San-chong (TW); Weileun Fang, Hsinchu (TW)

(73) Assignee: Walsin Lihwa Corp., Taipei (TW)

( * ) Notice: Subject to any disclaimer, the term of this patent is extended or adjusted under 35 U.S.C. 154(b) by 295 days.

(21) Appl. No.: 10/187,714

(22) Filed: Jul. 1, 2002

(65) Prior Publication Data

US 2004/0097001 A1 May 20, 2004

(30) Foreign Application Priority Data

Mar. 5, 2002 (TW) ....................... 91104082 A (51) Int. Cl.$^7$ ..................... H01L 21/00; B82B 1/00
(52) U.S. Cl. ............................ 438/48; 438/52
(58) Field of Search .................. 438/48, 52, 50; 257/414, 415, 418, 419

(56) References Cited

U.S. PATENT DOCUMENTS

| | | | | |
|---|---|---|---|---|
| 3,639,812 A | * | 2/1972 | Iijima | 257/418 |
| 5,998,816 A | * | 12/1999 | Nakaki et al. | 257/254 |
| 6,136,630 A | * | 10/2000 | Weigold et al. | 438/50 |
| 6,239,473 B1 | * | 5/2001 | Adams et al. | 257/419 |
| 6,342,430 B1 | * | 1/2002 | Adams et al. | 438/424 |
| 6,461,888 B1 | * | 10/2002 | Sridhar et al. | 438/52 |

* cited by examiner

Primary Examiner—W. David Coleman
(74) Attorney, Agent, or Firm—Haverstock & Owens LLP (57) ABSTRACT

A corner-compensation method for fabricating MEMS (Micro-Electro-Mechanical System) is provided. The method includes steps of: (a) providing a substrate; (b) forming a conductive layer on the substrate; (c) sequentially forming a masking layer having structural openings and a photoresist layer on the conductive layer; (d) executing a photolithography for etching the photoresist layer and the masking layer to form at least one hole penetrating the photoresist layer and the masking layer; (e) etching the conductive layer and the substrate to extend the at least one hole to upper portions of the substrate; (f) removing the photoresist layer and etching the conductive layer and the substrate via the structural openings and the at least one hole respectively to form deep trench structures having different depths; (g) forming a peripheral compensation structure on a side-wall portion of the deep trench structure having the different depths; (h) removing portions of the peripheral compensation structure laterally and the substrate for exposing an uncompensated silicon structure; and (i) side etching the uncompensated silicon structure to be terminated by the peripheral compensation structure around the at least one hole.

10 Claims, 11 Drawing Sheets

Non-undercut Area
Undercut Area

CORNER COMPENSATION METHOD FOR FABRICATING MEMS AND STRUCTURE THEREOF

FIELD OF THE INVENTION

This invention relates to a corner compensation method for manufacturing MEMS (Micro-Electro-Mechanical System) and a structure thereof, and more particularly to be applied to fabricate a post micro-plane on a (111) silicon wafer.

BACKGROUND OF THE INVENTION

Recently, the method for fabricating HARMs (High Aspect Ratio Microstructures) by utilizing SCS (Single Crystal Silicon) exceeds the shape limitation of the traditional bulk micromachining process and thereby can diversify the fabrication of a thick structure. Compared with a thin film structure in the surface micromachining process, the thick structure provides several advantages including the smaller dynamic deformation, the higher driving frequency, the tiny influence of the plane disturbance, and the large range of the rigidity of the structure. Furthermore, if the thick structure can be actuated and detected electrostatically, the static electricity and the capacitance of the structure will become larger owing to the increase of the thickness, and thus the efficiency of detection and actuation will be improved substantially. In addition, the single crystal silicon employed to form the main structure is a widely used material in MEMS (Micro-Electro-Mechanical System) even if single crystal silicon is brittle. However, the brittleness-destroying probability could be reduced by controlling the defects of the SCS because the sizes of MEMS elements are usually small, thereby increasing the flexibility thereof. Besides, the mechanical strength of the SCS is greater than that of most metals and alloys. Thus the SCS do not have the thin film stress problem. Furthermore, since the thermal expansion coefficient of the SCS is smaller than that of the metals, the signal shift phenomenon induced by temperature variation will become smaller. Additionally, in contrast, the Young's modulus and the Poisson's ratio in all orientations on the (111) silicon wafer surface still have the same superiority and can reduce the error caused by the different mechanical characteristics of different crystal lattices. In view of the aforesaid, the HARMs bulk micromachining process with the (111) SCS can actually satisfy numerous design demands of the MEMS elements.

Figure 1A:
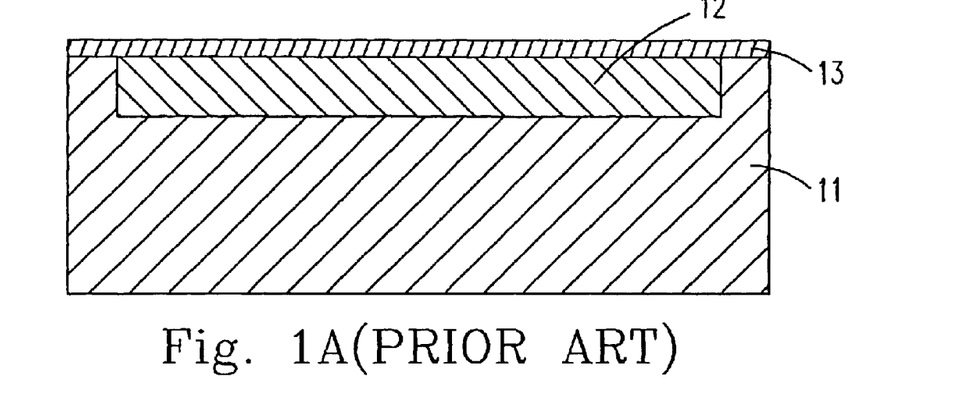
FIGS. 1A~1F show the fabrication flowchart of HARMs actuator in a typical (111) wafer micromachining process according to the present invention.
Figure 1B:
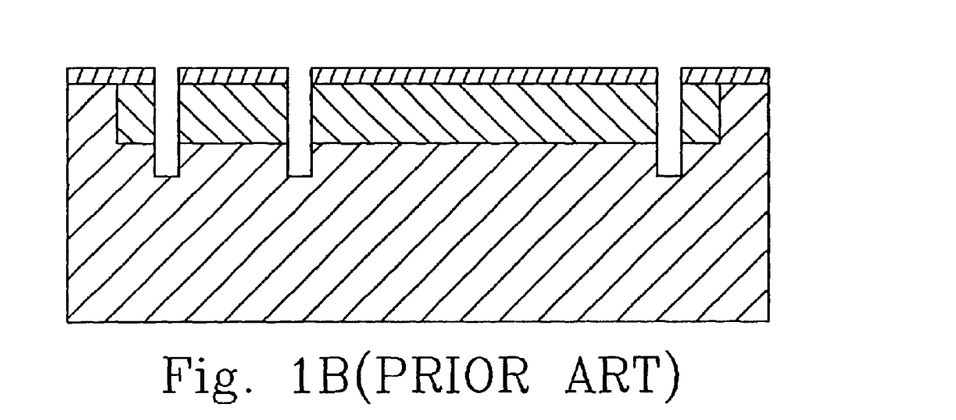
Figure 1C:
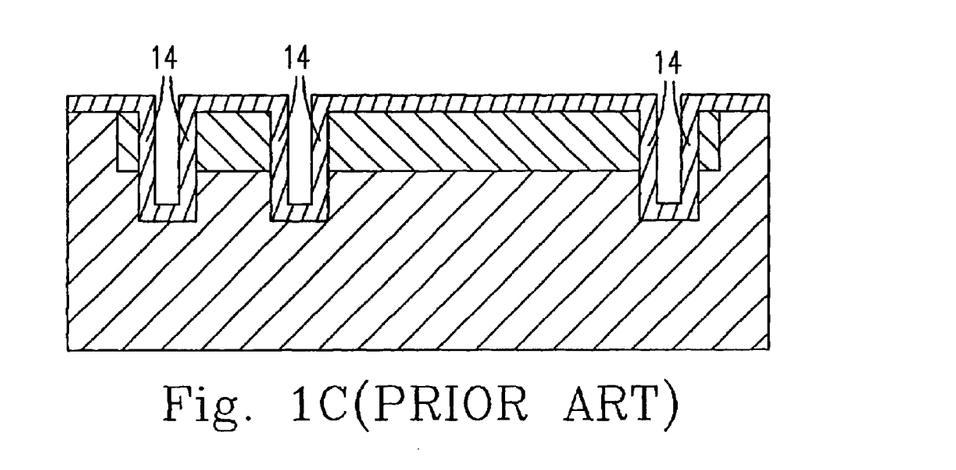
Figure 1D:
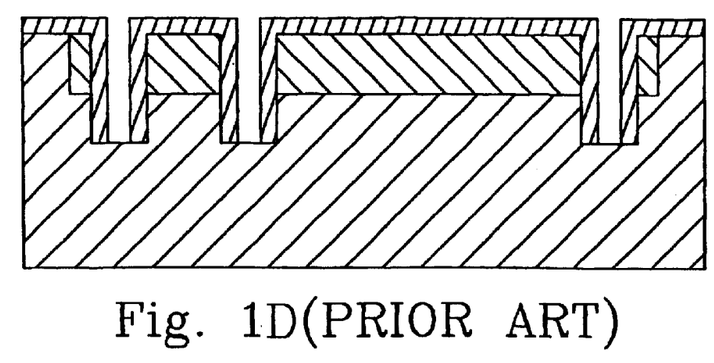
Figure 1E:
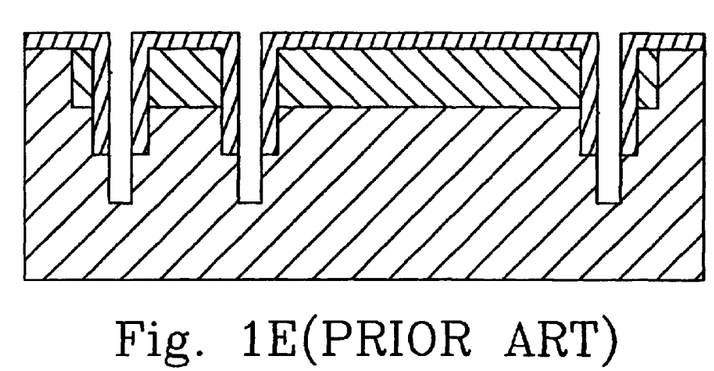
Figure 1F:
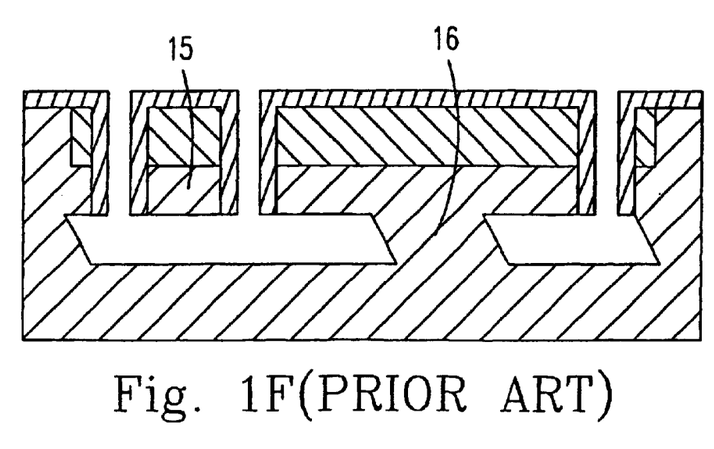

The (111) plane is the etch-stop plane of silicon wet etching in an aqueous alkaline etchant. (111) SCS is directed to a wafer whose (111) lattice planes all are vertical to the normal. The general HARMs bulk micromachining process of the (111) SCS utilizes the specific (111)-oriented silicon to cooperate the anisotropic side etching and thereby to fabricate the main structure which can be released as an actuated structure via etching having a large-area mass with paralleled top and bottom surfaces. Please refer to FIGS. 1A~1F. FIGS. 1A~1F show the flowchart of a typical fabrication method of HARMs actuator for employing the (111) wafer. First, a silicon substrate 11 is provided to form the electrode 12 of the actuator by selectively diffusing the dopants, and then a masking layer 13 which usually can be silicon oxide having high etching selectivity is grown thereon (as shown in FIG. 1A). Second, the masking layer 13 is patterned and then been deep etched to define the depth of the structure layers (as shown in FIG. 1B). Third, for protecting the sidewall, the silicon oxide film 14 having great sidewall attachment is grown thereon (as shown in FIG. 1C). Fourth, the RIE (Reactive Ion Etching) is executed for removing the silicon oxide thereunder and to be beneficial to the next silicon deep etching (as shown in FIG. 1D). Fifth, the deep etching is executed to define the depth of the sacrificed layer (as shown in FIG. 1E). Sixth, the anisotropic etching and the convex-corner undercut of the (111) wafer are employed to release the main structure 15 as an actuated structure for accomplishing the whole processes (as shown in FIG. 1F). However, although the (111) wafer has the specific characteristic of side etching, if the etching time is out of control, it wilt cause the post area 16 structural unstable. Moreover, the post area 16 will be undercut and more seriously to affect the stability of the structure even the electricity. Among the practical structures, the undercut is avoided in many post areas and these post area can be closely connected to the substrate, such as the boundary anchor of the releasing structure, the bonding pad of the electrode, and the wafer bonding area. For avoiding these post areas being convex-corner undercut, the most direct method is to make the width of the post areas greatly larger than the width of the released areas. But this will cause the occupied area too big and limit the design. For reducing the post areas, except helping the design of the structural shape and orientation, the traditional corner compensation, which extends the corners partially, also can increase the undercutting time of the post areas. But the design of the plane is still inhibited, because the occupied post areas are large. Consequently, the smaller post area still can not be fabricated under this condition.

In addition, although the (111) silicon wafer can fabricate many structures which can not be accomplished by the surface micromachining process, there still has a problem of insufficient conductive depth. Because the depth of silicon diffusion is always limited to be less than 10 micrometers, some deep portions of the thick structures can not own the conductivity, and thus the characteristics of actuation and detection are also influenced. Although this problem can be solved by attaching a conductive/dielectric layer thereon, some sequential fabrication problems will still be shown, e.g., the difficulty of wafer connecting, the uneasy attachment of the metal sidewall, and the machine limitation. All these will lose the advantages of the single crystal silicon.

Because of the technical defects described above, the applicant keeps on carving unflaggingly to develop "corner compensation method for fabricating MEMS and structure thereof" through wholehearted experience and research.

Figure 2A:
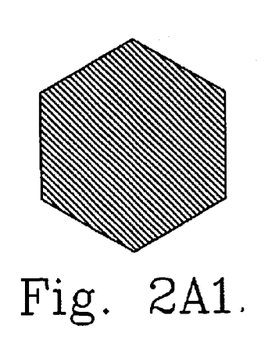
FIG. 2A is a schematical view of the undercutting process of the (111) wafer without corner compensation.
FIG. 2B is a schematical view of the undercutting process of (111) wafer with corner compensation by boron posts.
Figure 2A:
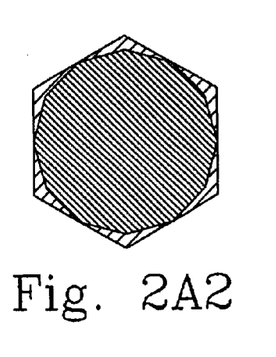
Figure 2A:
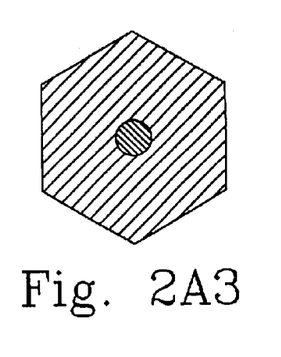

SUMMARY OF THE INVENTION it is an object of the present invention to provide a designing method of corner compensation for fabricating the post micro-plane on the (111) silicon wafer. Take the fabrication of a hexagonal post micro-plane as an example. Please refer to FIGS. 2A1–2A3. When the micro-plane is oriented to aim one edge thereof at one edge of the (111) wafer, perfectly all edges of the hexagon should be the edges of the (111) wafer. Thus, because of the etch resistance of the (111) wafer, the wafer structure will not be undercut (as shown in FIG. 2A1). However, some non-(111) planes are unavoidably shown in the convex of the hexagon, this deficiency is amplified after a period of time during the etching process and becomes the initial stage of the undercutting. Thus, side etching will be started here, and then the sidewall of the (111) wafer will shrink inside (as shown in FIG. 2A2). As time passes, the base of the whole structure will be undercut, and the micro-plane will be released thereafter (as shown in FIG. 2A3).

Figure 2B:
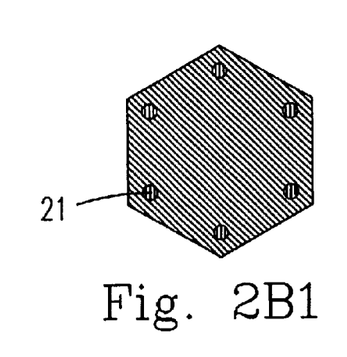
Figure 2B:
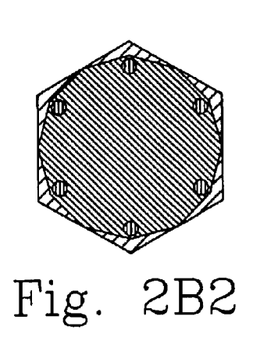
Figure 2B:
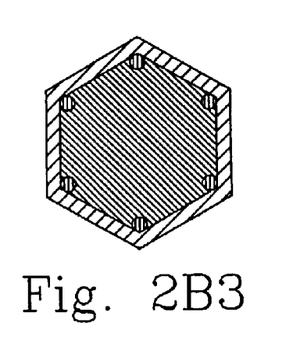

The compensation method according to the present invention is trying to bring the silicon boron diffused (P++Si) etch-stopped post 21, so-called boron post, into the convex of the inscribed hexagon of the micro-plane (as shown in FIGS. 2B1–2B3). Because the silicon boron diffusion is employed to stop the etching and to avoid the convex etched for a longer period of time, the edges of the hexagon will not be undercut owing to the absence of the initial stage of etching (as shown in FIG. 2B2), and the compensation result can be achieved under the smallest area (as shown in FIG. 2B3). Consequently, the size and the shape of the micro-plane can be designed randomly because the additional compensation structure is not needed any more. Furthermore, the etching time can be elongated substantially to release the main structure with larger area.

According to another aspect of the present invention, a corner-compensation method for fabricating MEMS (Micro-Electro-Mechanical System) includes steps of: (a) providing a substrate; (b) forming a conductive layer on the substrate; (c) sequentially forming a masking layer having structural openings and a photoresist layer on the conductive layer; (d) executing a photolithography for etching the photoresist layer and the masking layer to form at least one hole penetrating the photoresist layer and the masking layer; (e) etching the conductive layer and the substrate to extend the at least one hole to upper portions of the substrate; (f) removing the photoresist layer and etching the conductive layer and the substrate via the structural openings and the at least one hole respectively to form deep trench structures having different depths; (g) forming a peripheral compensation structure on a side-wall portion of the deep trench structure having the different depths; (h) removing portions of the peripheral compensation structure laterally and the substrate for exposing an uncompensated silicon structure; and (i) side etching the uncompensated silicon structure to be terminated by the peripheral compensation structure around the at least one hole.

Preferably, the substrate is a silicon substrate.

Preferably, the conductive layer includes a silicon boron diffused conductive layer.

Preferably, the masking layer in step (b) includes silicon oxide.

Preferably, the step (e) is executed by DRIE (Deep Reactive Ion Etching).

Preferably, the step (f) is executed by DRIE.

Preferably, the peripheral compensation structure in step (g) is formed by a wet etching resist material.

Preferably, the wet etching resist material includes a silicon boron diffused material.

Preferably, the step (h) is executed by DRIE.

Preferably, the step (i) is executed by a silicon wet etching.

In accordance with an aspect of the present invention, a structure utilizing a corner compensation method for fabricating MEMS includes a substrate, a post structure having a cylindrical shape and upwardly extended up from the substrate, a micro-plane disposed around the post structure and parallel with the substrate via the post structure, and a peripheral compensation structure formed on a sidewall of the micro-plane to protect the micro-plane.

Preferably, the substrate is a silicon substrate.

Preferably, the micro-plane further includes a conductive structure.

Preferably, the conductive structure is executed by a silicon boron diffused material.

Preferably, the conductive structure further includes a masking layer thereon.

Preferably, the masking layer is formed of a silicon oxide.

Preferably, the peripheral compensation structure is formed by a boron diffused silicon material.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 3:
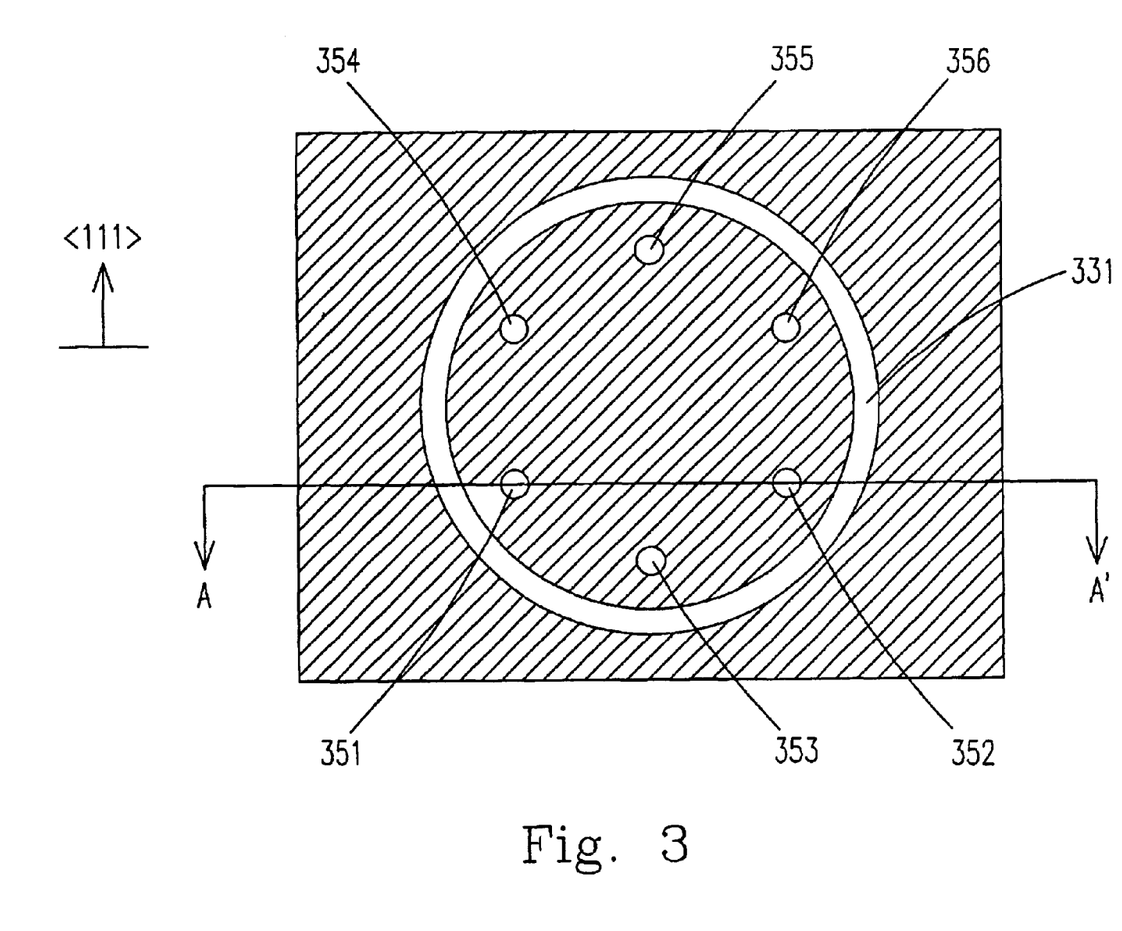
FIG. 3 is a schematical flat view of the structure in a preferred embodiment according to the present invention.
Figure 4A:
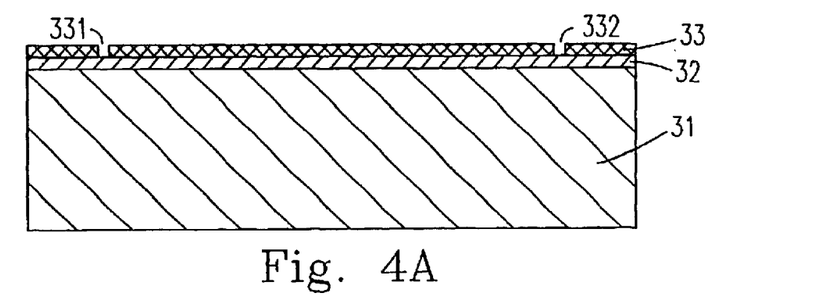
FIGS. 4A~4H are showing the flowchart of the fabrication method in a preferred embodiment according to the present invention.
Figure 4B:
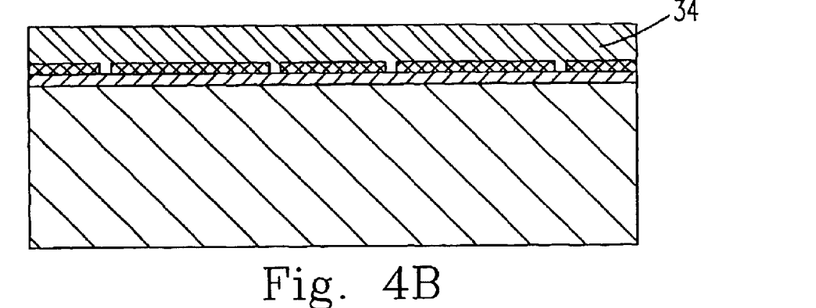
Figure 4C:
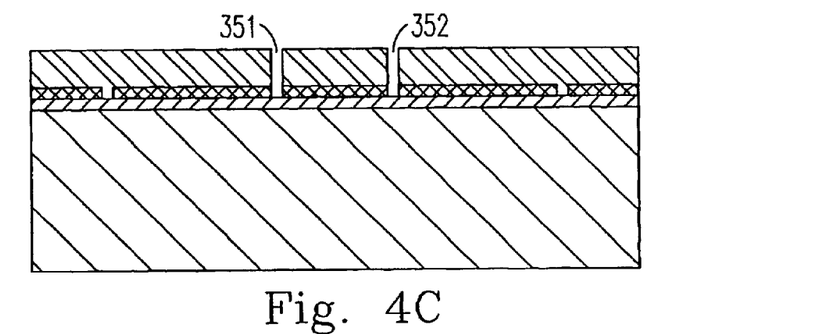
Figure 4D:
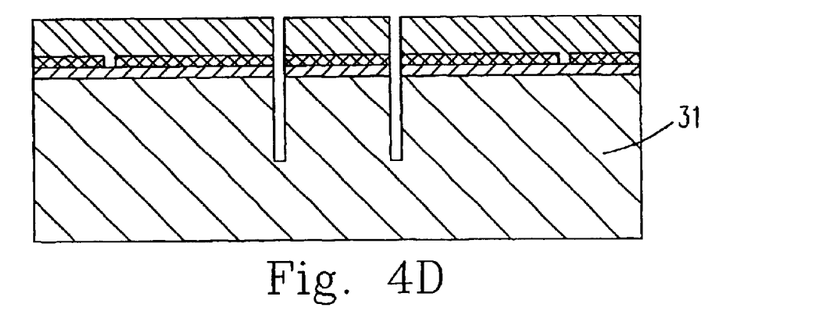
Figure 4E:
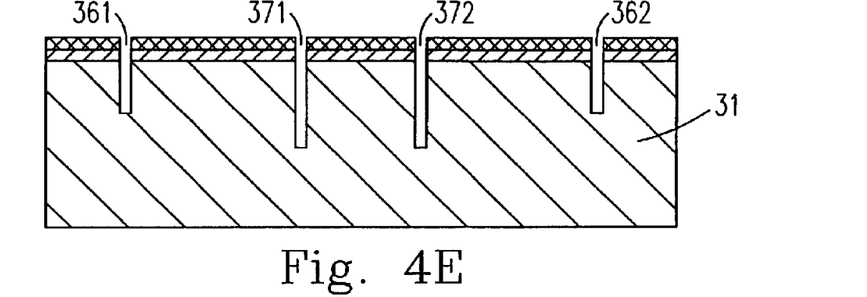
Figure 4F:
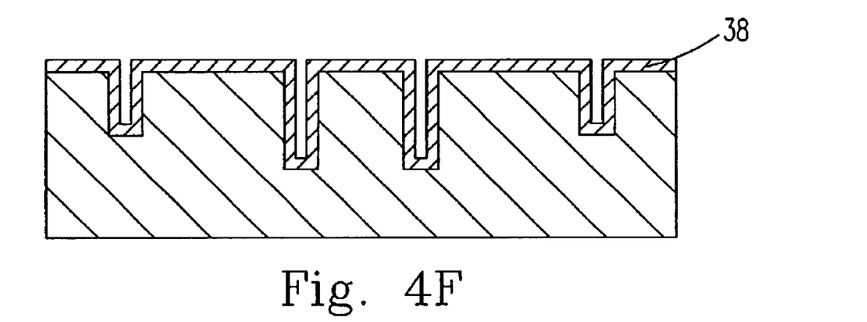
Figure 4G:
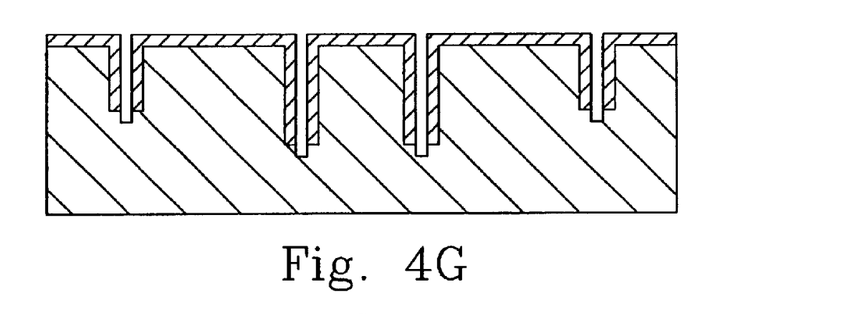
Figure 4H:
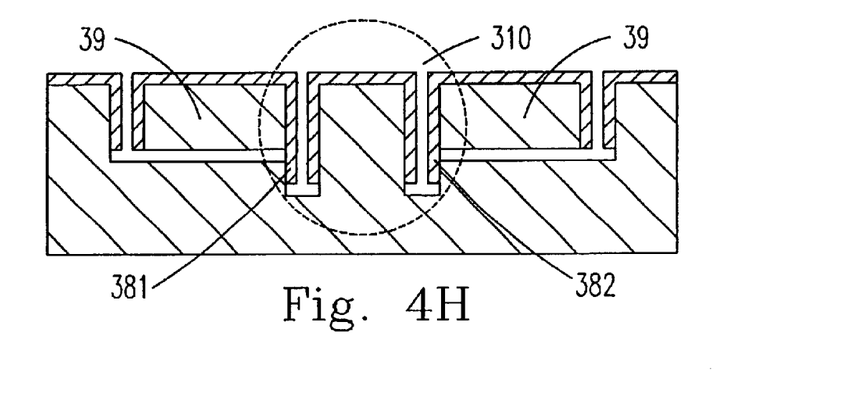
Figure 5A:
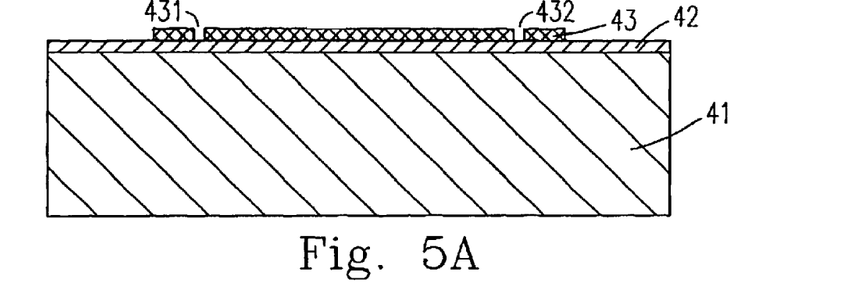
FIGS. 5A~5H are showing the flowchart of the fabrication method in another preferred embodiment according to the present invention.
Figure 5B:
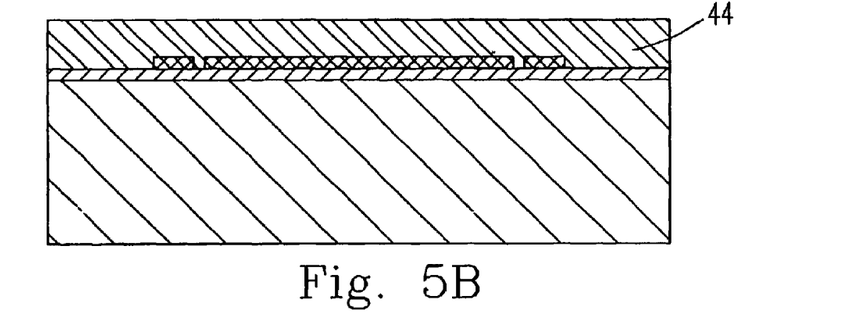
Figure 5C:
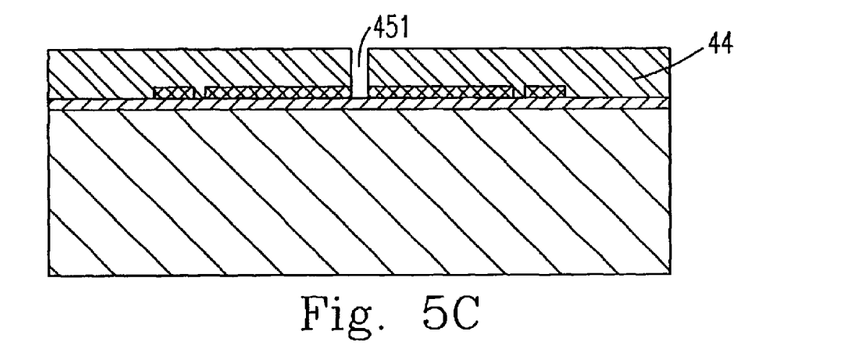
Figure 5D:
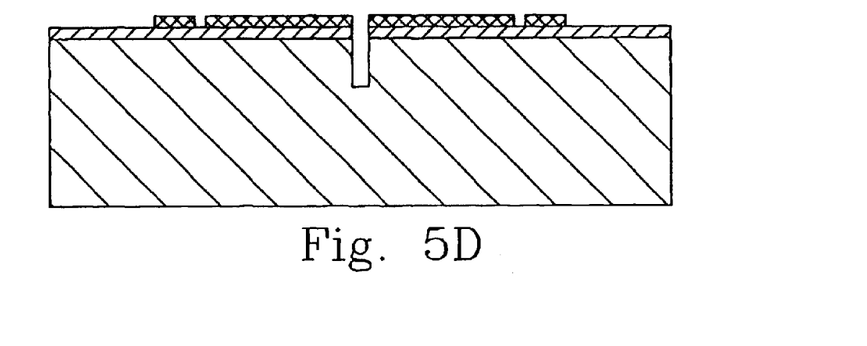
Figure 5E:
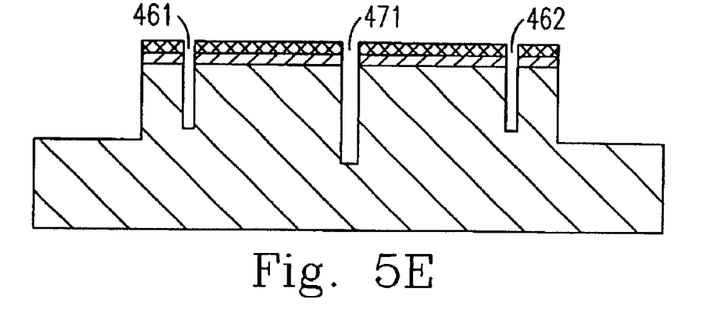
Figure 5F:
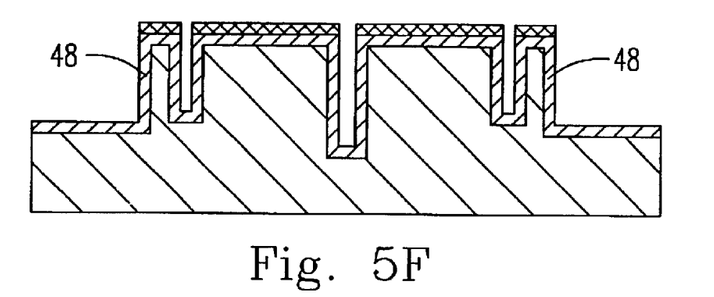
Figure 5G:
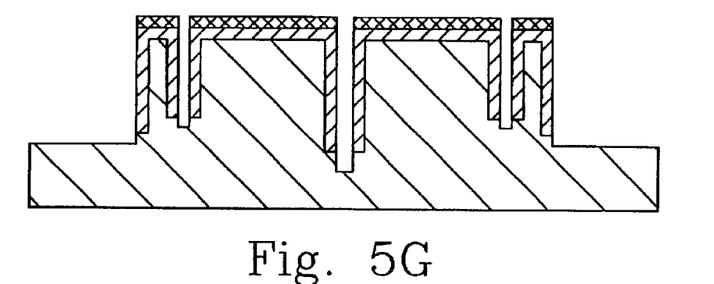
Figure 5H:
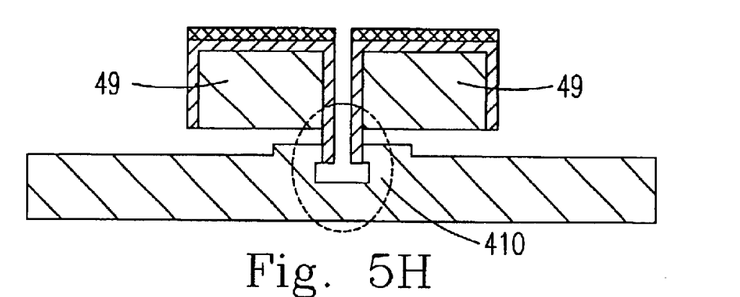

Please refer to FIG. 3. FIG. 3 shows the schematical flat view of the structure in a preferred embodiment according to the present invention. The positions of a plurality of openings 351–356 are determined by the corner compensation method described in the summary. And please refer to FIGS. 4A~4H simultaneously. FIGS. 4A~4H show the flowchart of the fabrication method in a preferred embodiment according to the present invention for improving conventional methods. FIGS. 4A~4H show the cross section A–A' in FIG. 3. As shown in FIG. 4A, a conductive layer 32 is formed on a silicon substrate 31, and the conductive layer 32 is formed by silicon boron diffusion. Sequentially, a masking layer 33 (can be formed of $SiO_x$) is further formed on the conductive layer 32, and the masking layer 33 has a cylindrical opening 331. Then, as shown in FIG. 4B, a photoresist layer 34 is formed on the masking layer 33. Later, as shown in FIG. 4C, a photolithography is executed to pattern the photoresist layer 34 and then to etch the masking layer for penetrating the masking layer 33 to form two openings 351 and 352. As shown in FIG. 4D, the DRIE (Deep Reactive Ion Etching) is firstly executed to etch the conductive layer 32 and the substrate 31 to extend the two openings 351 and 352 to upper portions of the substrate 31. Please refer to FIG. 4D, after removing the photoresist layer 34 by acetone, the DRIE is secondly executed to remove the conductive layer 32 and the substrate 31 and to form the deep trench structures 361, 362, 371, and 372 having different depths. As shown in FIG. 4F, a peripheral compensation structure is formed on the peripheral of the deep trench structures having different depths, wherein the peripheral compensation structure 38 is formed by silicon boron diffusion. Please sequentially refer to FIG. 4G, the DRIE is thirdly executed to remove portions of the lateral sidewall structure and the substrate 31 to expose the uncompensated silicon structure. Finally, as shown in FIG. 4H, the uncompensated structure is side etched, and the desired releasing main structure 39 will be defined by etching which is stopped by the peripheral compensation structures 381 and 382 on the two sides of the openings. Thus, the post structure in the center of a plurality of the post structures can form a supporting structure 310 via the peripheral compensation structures 381 and 382 on the two sides to achieve the purpose of corner compensation.

Another preferable embodiment according to the present invention is illustrated in FIG. 5. FIG. 5 shows the fabrication method of a micro-plane which is supported only by silicon boron diffused posts according to the technologies described above. The steps are described as follows: first, forming a conductive layer 42 on the substrate 41, as shown in FIG. 5A, wherein the conductive layer 42 is formed by a silicon boron diffusion, and further forming a masking layer 43 (can be formed of SiO,) on the conductive layer 42, wherein the masking layer has cylindrical openings 431 and 432; second, forming a photoresist layer 44, as shown in FIG. 5B, on the masking layer 43; third, executing a photolithography, as shown in FIG. 5C, to pattern the photoresist layer 44 and then to etch the masking layer 43 for penetrating the masking layer 43 to form a hole 451; fourth, after removing the photoresist layer 44 by acetone, executing the DRIE firstly to etch the conductive layer 42 and the substrate 41, as shown in FIG. 5D, to extend the hole 451 down to upper portions of the substrate 41; fifth, as shown in FIG. 5E, executing the DRIE secondly to remove portions of the conductive layer 42 and the substrate 41 for forming deep trench structures 461, 462, and 471 having different depths; sixth, forming a peripheral compensation structure on the peripheral of the deep trench structures having different depths, wherein the peripheral compensation structure 48 is formed by a silicon boron diffusion, as shown in FIG. 5F; seventh, executing the DRIE thirdly, as shown in FIG. 5G, to remove the lateral peripheral compensation structure and portions of the substrate 41 to expose the uncompensated silicon structure; and finally, as shown in FIG. 5H, side etching the uncompensated silicon structure, wherein the desired releasing main structure 49 will be defined by etching which is stopped by the peripheral compensation structure of the two sides of the openings, and forming a boron post 410 for being the supporting base of the micro-plane.

Figure 6A:
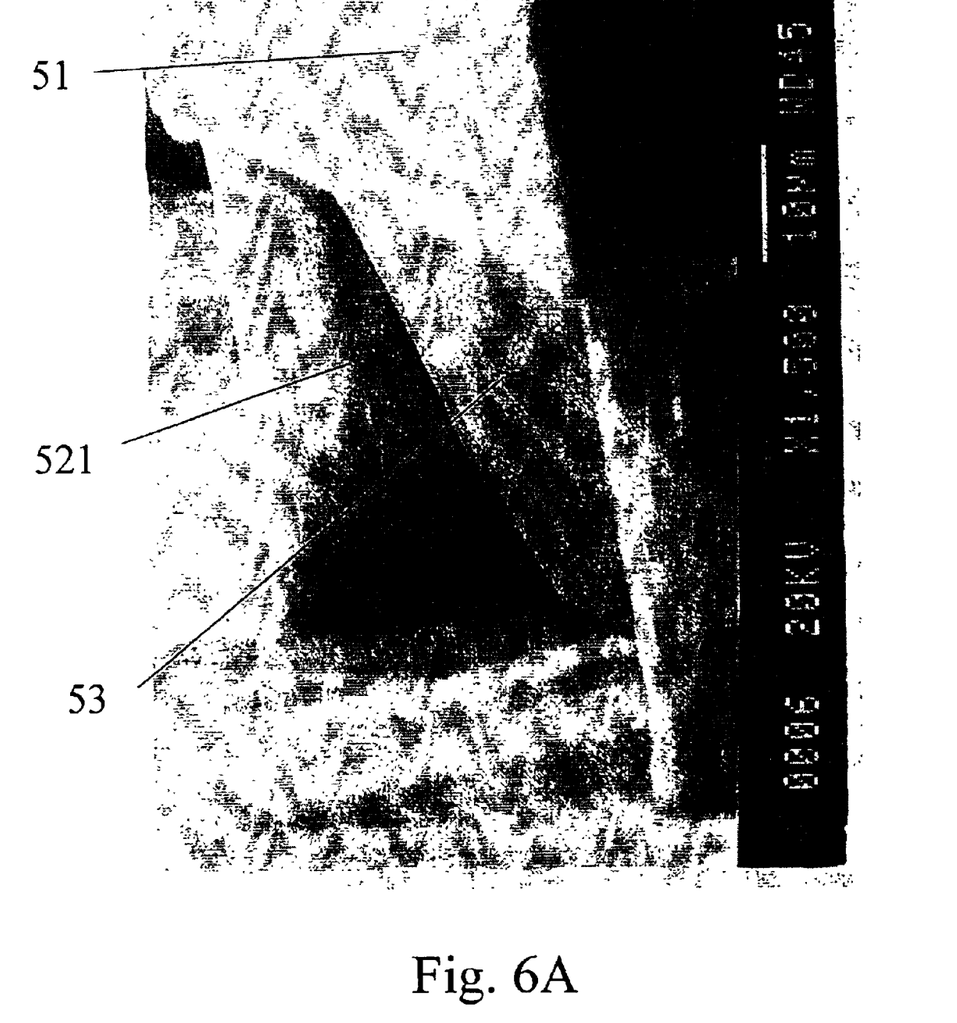
FIGS. 6A~6C are showing the microscopic views around the boron posts according to the present invention.
Figure 6B:
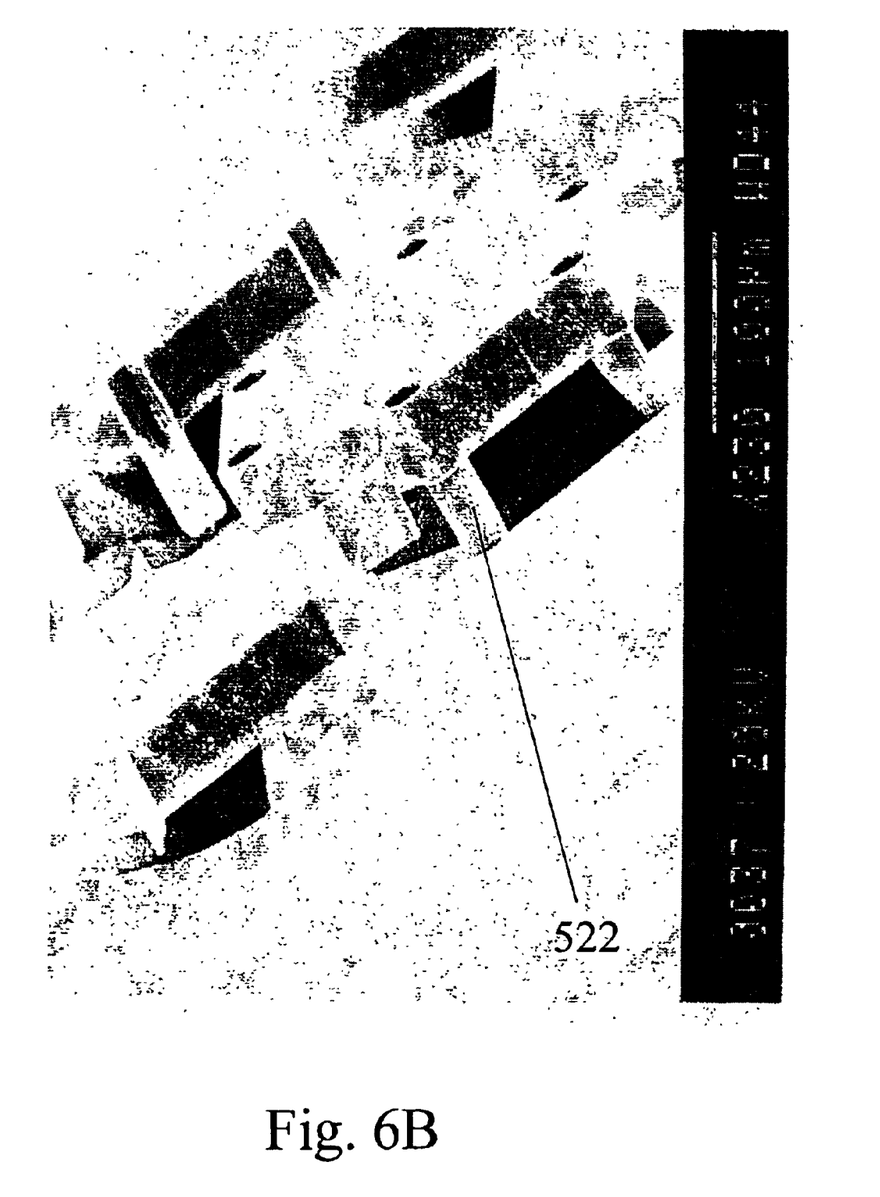
Figure 6C:
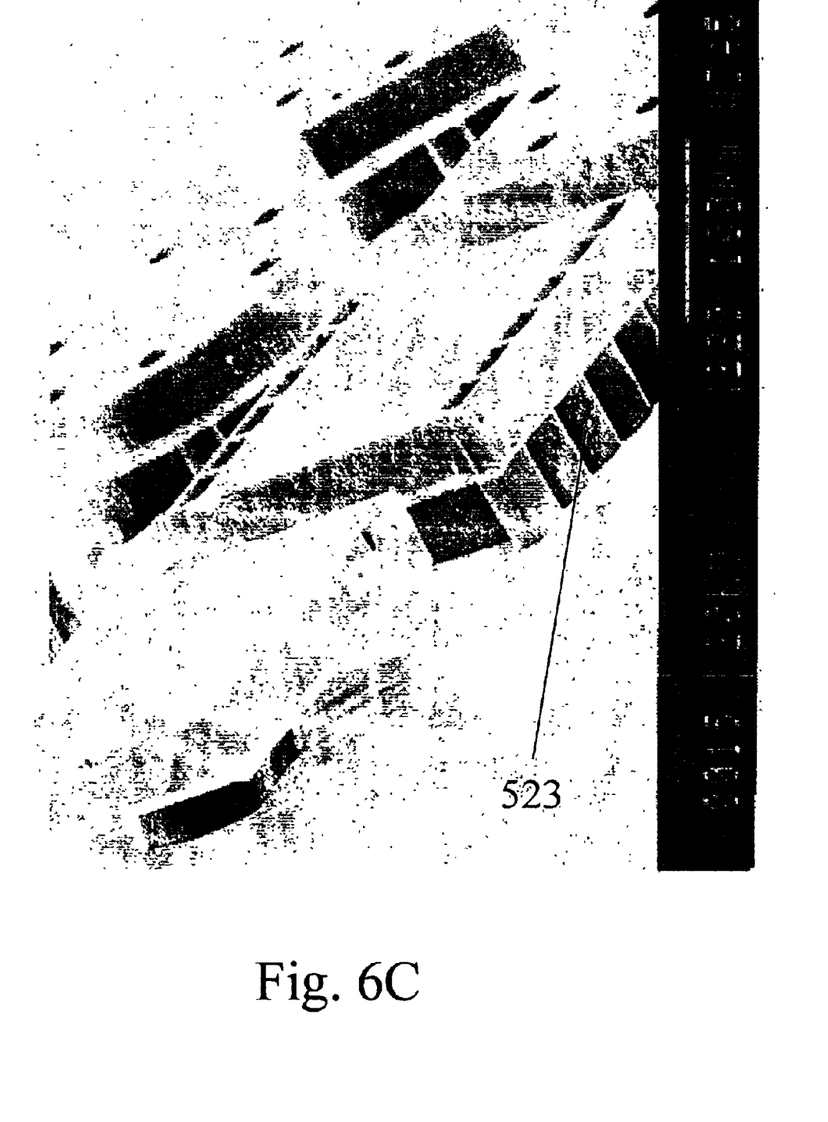

The microscopic views are shown to prove the result. Please refer to FIG. 6A showing the microscopic view around the boron posts. It can be seen that, because the peripheral compensation structure of the boron post 521 and the (111) lattice 531 present under the micro-plane 51, the undercut can be inhibited. As shown in FIG. 6B, comparing with the corner-compensation method of the hexagonal-plane, the traditional corner-elongation method, which is located in the down-left position of the picture, will still be undercut seriously, but, under the condition of employing the boron post structure 522 as the corner-compensation, it is obviously shown that the whole structure is almost connected closely to the bottom side completely. This result closely meets the expectancy. It can economize the use of area, reduce the limitation of design, and is benefit to the sequential processes. FIG. 6C shows the corner-compensation of non-hexagonal-plane. In FIG. 6C, even the edge of the plane doesn't direct to (111) orientation, through the properly definition of the positions of the boron posts, the undercut can still be inhibited well. But under the same condition, the uncompensated non-hexagonal-plane, which is located in the down-left position of the picture, however, is undercut seriously.

In view of the aforesaid, the microelements fabricated by the (111) silicon according to the present invention are provided with the advantages of the (111) silicon material. Different from the conventional process, the present micromachining process can release the structure without equaling the thinness of the structure or leaving too many etching windows. Consequently, the present invention has the ability to fabricate the structure with high equivalent area and inertia mass. Furthermore, the boron sidewall-protecting layer and the boron posts can significantly promote the performance and the function of the whole microelement.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A corner-compensation method for fabricating MEMS (Micro-Electro-Mechanical System), comprising steps of:
    (a) providing a substrate;
    (b) forming a conductive layer on said substrate;
    (c) sequentially forming a masking layer having structural openings and a photoresist layer on said conductive layer;
    (d) executing a photolithography for etching said photoresist layer and said masking layer to form at least one hole penetrating said photoresist layer and said masking layer;
    (e) etching said conductive layer and said substrate to extend said at least one hole to upper portions of said substrate;
    (f) removing said photoresist layer and etching said conductive layer and said substrate via said structural openings and said at least one hole respectively to form deep trench structures having different depths;
    (g) forming a peripheral compensation structure on a side-wall portion of said deep trench structure having said different depths;
    (h) removing portions of said peripheral compensation structure laterally and said substrate for exposing an uncompensated silicon structure; and
    (i) side etching said uncompensated silicon structure to be terminated by said peripheral compensation structure around said at least one hole.

2. A method according to claim 1 wherein said substrate is a silicon substrate.

3. A method according to claim 1 wherein said conductive layer comprises a silicon-boron diffused conductive layer.

4. A method according to claim 1 wherein said masking layer includes silicon oxide.

5. A method according to claim 1 wherein said step (e) is executed by DRIE (Deep Reactive Ion Etching).

6. A method according to claim 1 wherein said step (f) is executed by DRIE.

7. A method according to claim 1 wherein said peripheral compensation structure in step (g) is formed by a wet etching resist material.

8. A method according to claim 7 wherein said wet etching resist material comprises a silicon-boron diffused material.

9. A method according to claim 1 wherein said step (h) is executed by DRIE.

10. A method according to claim 1 wherein said step (I) is executed by a silicon wet etching.

* * * * *

UNITED STATES PATENT AND TRADEMARK OFFICE
CERTIFICATE OF CORRECTION

PATENT NO. : 6,949,396 B2 Page 1 of 1
DATED : September 27, 2005
INVENTOR(S) : Jerwei Hsieh et al.

It is certified that error appears in the above-identified patent and that said Letters Patent is hereby corrected as shown below:

Column 2,
Line 9, replace "wilt" with -- will --.
Line 45, replace "it" with -- It --.

Signed and Sealed this

Third Day of January, 2006

JON W. DUDAS
*Director of the United States Patent and Trademark Office*